(12) United States Patent
Becker

(10) Patent No.: US 6,788,615 B2
(45) Date of Patent: Sep. 7, 2004

(54) SYSTEM AND METHOD FOR LOW AREA SELF-TIMING IN MEMORY DEVICES

(75) Inventor: Scott T. Becker, Darien, IL (US)

(73) Assignee: Artisan Components, Inc., Sunnyvale, CA (US)

( * ) Notice: Subject to any disclaimer, the term of this patent is extended or adjusted under 35 U.S.C. 154(b) by 0 days.

(21) Appl. No.: 10/364,720

(22) Filed: Feb. 10, 2003

(65) Prior Publication Data

US 2004/0156261 A1 Aug. 12, 2004

(51) Int. Cl.[7] .................................................. G11C 8/00
(52) U.S. Cl. .................. 365/233; 365/230.03; 365/210
(58) Field of Search ............................ 365/233, 230.03, 365/210, 230.06

(56) References Cited

U.S. PATENT DOCUMENTS 6,002,633 A * 12/1999 Oppold et al. ......... 365/230.03
6,282,131 B1 * 8/2001 Roy ............................ 365/233

* cited by examiner

Primary Examiner—Huan Hoang
(74) Attorney, Agent, or Firm—Martine & Penilla, LLP

(57) ABSTRACT

An invention for self-timing in a memory device is provided. The self-timing system includes a dummy global wordline signal, which is configured to follow a global timing pulse for a memory device. In addition, a row of at least one non-timing memory banks is included. Each non-timing memory bank includes a model row in electrical communication with the dummy global wordline signal. Each model row is comprised of a plurality of load cells. The self-timing system further includes a timing memory bank having a global timing column. The global timing column is comprised of a plurality of load cells that are coupled via at least one bitline. In operation, the global timing column responds to the dummy global wordline signal to provide a self-timing reset signal for the memory device. In this manner, the self-timing reset signal is provided to each active memory bank in the row of memory banks.

20 Claims, 9 Drawing Sheets

SYSTEM AND METHOD FOR LOW AREA SELF-TIMING IN MEMORY DEVICES

BACKGROUND OF THE INVENTION

1. Field of the Invention

The present invention relates generally to integrated circuits, and more particularly to methods and apparatuses for improved memory self-timing circuitry.

2. Description of the Related Art

Currently, semiconductor memory cores are laid-out in an array format, such that each individual core cell is coupled to a wordline and a pair of differential bitlines. Access to data stored in a selected core cell generally is provided by associated memory accessing circuitry designed around the memory core. This memory accessing circuitry typically includes addressing circuitry for selecting a core cell, wordline drivers for driving a selected wordline, and sense amplifiers for amplifying the signal read from the selected core cell.

For ease of understanding, FIG. 1 shows a block diagram of a memory bank having a memory core 100 and associated access circuitry. As in conventional memory core designs, a plurality of core cells 102 is arrayed throughout the memory core 100. In this example, a control block circuit 110 is used to control access to selected memory core cells 102 using wordline drivers 106 and sense amplifiers (SA) 104.

As shown in FIG. 1, the control block circuit 110 is configured to produce a signal 116a that triggers a selected wordline driver 106 upon a rising edge of the signal 116a. When the signal 116a experiences a falling edge (ie., at a time determined by a conventional self-timing architecture described below), a signal 116b initiates the sensing of data through the selected sense amplifiers 104. As shown, the wordline drivers 106 are connected to each of the core cells 102 via wordlines, which interconnect each of the core cells 102 in a horizontal direction. In a like manner, the sense amplifiers 104 are connected to each of the core cells 102 in the vertical direction, through the use of differential bitlines.

In a conventional memory block, designers have used a self-timing architecture that enables each memory bank to determine when the sense amplifiers 104 should commence sensing data from the core cells 102 in the memory core 100. Self-timing architectures generally are used to approximate a standard delay time (i.e., generally the worst case timing delay for a given core cell), which will be used when accessing the core cells 102. The self-timing architecture is utilized because the actual delay time of a particular core cell 102 can vary from other core cells in the memory core depending on the location of the particular core cell 102. By way of example, a particular core cell 103 is located at the furthest location from a given wordline driver 106 and a given sense amplifier 104.

Therefore, an RC delay associated with the wordline that couples the wordline driver 106 to the core cell 103, and the RC delay associated with the bitlines that couple a sense amplifier 104 to the core cell 103, will have a combined RC delay that is larger than any other core cell 102 in the memory core 100. For example, the combined RC delay of the wordline and the bitlines that couple to a core cell 101, will be smaller than any other core cell of the memory core 100. Therefore, a self-timing architecture which includes a model wordline driver 106', core cells 102', a model core cell 103', a model wordline 112a, model bitlines 112b, sense amplifier 104', and a self-timing return path 114 serves to establish the aforementioned standard delay time.

Accordingly, the self-timing architecture is well suited to estimate when enough bitline differential has been achieved (i.e., due to the worst case model core cell 103') to correctly perform a sense amplification to read the data of a given core cell 102 in the memory core 100. In operation, the control block circuitry initiates the select signal 116a to the model wordline driver 106' to access the model core cell 103'. When the model core cell 103' has been accessed, a signal is passed through the model bitlines 112b, through sense amplifier 104' and along the self-timing return path 114, that communicates to the control block circuit 110. When using a multi-bank memory, the above described self-timing structure is duplicated in each memory bank, as shown in FIG. 2.

FIG. 2 is a diagram showing a prior art multi-bank memory 200. As shown, the prior art multi-bank memory 200 includes a plurality of memory banks B0 to Bn, each in communication with a plurality of global wordlines 208, which are generated by a plurality of global wordline drivers 202. In addition, each memory bank B0–Bn is in communication with a global control block 204, which provides control signals for the global wordline drivers and the global sense amps 206.

As described above, each memory bank B0–Bn includes a memory core 100a–100n having a plurality of core cells, each accessed using the local wordline drivers 106. Further, each memory bank B0–Bn includes a model row having a model wordline driver 106', core cells 102', and a model core cell 103'. A model column having a plurality of core cells 102', model bitlines, and a sense amplifier 104' is also included in each memory bank B0–Bn. In addition, a self-timing path 114 serves to establish the standard delay time for the local control block 10 of each memory bank.

Unfortunately, as shown if FIG. 2, the prior art self-timing architecture requires a model column of core cells 102', model bitlines, and a sense amplifier 104' on each memory bank. As a result, the prior art self-timing architecture requires a large amount of area for the model columns, which increases cost and reduces the area available for functional core cells. Thus, in view of the foregoing, there is a need for a self-timing architecture that requires less area than conventional self-timing architectures in multi-bank memories.

SUMMARY OF THE INVENTION

Broadly speaking, the present invention fills these needs by providing a self-timing architecture that utilizes a single global timing column per row of memory banks to provide self-timing synchronization. In one embodiment, a self-timing system for a memory device is disclosed. The self-timing system includes a dummy global wordline signal, which is configured to follow a global timing pulse for a memory device. In addition, a row of at least two non-timing memory banks is included. Each non-timing memory bank includes a model row in electrical communication with the dummy global wordline signal. Each model row is comprised of a plurality of load cells. The self-timing system further includes a timing memory bank having a global timing column. The global timing column is comprised of a plurality of load cells that are coupled via a pair of bitlines. In operation, the global timing column responds to the dummy global wordline signal to provide a self-timing reset signal for the memory device. In this manner, the self-timing reset signal is provided to each active memory bank in the row of memory banks.

In one aspect, the timing memory bank, which includes the global timing column, can be located such that the global timing column responds slower to global wordlines than all other core cells in the row of memory banks. That is, the timing memory bank is located such that the global timing column represents the worst case timing. Generally, the load cells can be core cells, however, in some aspects the load cells can be transistors configured to mimic a load of a core cell. The timing memory bank can include a model row of load cells that are in communication with an active dummy local wordline signal, which is configured to follow the dummy global wordline signal. Further, the model row in each non-timing memory bank can be in communication with a non-active dummy local wordline signal, which is configured to have a low value. To design the self-timing system, a generator can be used.

In a further embodiment, a method is disclosed for self-timing synchronization for a row of memory banks in a memory device. A dummy global wordline signal is provided to at least three memory banks. As above, each memory bank includes a model row in electrical communication with the dummy global wordline signal. Also, each model row is comprised of a plurality of load cells. A self-timing reset signal for the memory device is provided using a single global timing column, which is in electrical communication with the dummy global wordline signal. As above, the global timing column includes a plurality of load cells. In this manner, each active memory bank in the row of memory banks is reset using the self-timing reset signal.

A memory device having a self-timing system for each row of memory banks is disclosed in a further embodiment of the present invention. The memory device includes a plurality of global wordlines drivers, which provide a plurality of global wordline signals to a row of memory banks. Each global wordline signal is configured to follow a global timing signal when the particular global wordline is selected. The memory device further includes a dummy global wordline signal that is configured to follow a global timing pulse. The row of memory banks includes at least two non-timing memory banks, each including a model row in electrical communication with the dummy global wordline signal. As above, each model row is comprised of a plurality of load cells. The row of memory banks further includes a timing memory bank having a global timing column that is comprised of a plurality of load cells coupled via at least one bit line. The global timing column responds to the dummy global wordline signal to provide a self-timing reset signal for the memory device. In this manner, the self-timing reset signal is provided to each active memory bank in the row of memory banks. In one aspect, the timing memory bank is located further from the global wordline drivers than each nontiming memory bank. As above, the memory device can be designed using a generator.

Advantageously, embodiments of the present invention utilize less area than conventional self-timing architectures for providing self-timing. In particular, by using a single global timing column in a row of memory banks, embodiments of the present invention save area on memory devices. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for a reduced area self-timing path in multi-bank memories. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
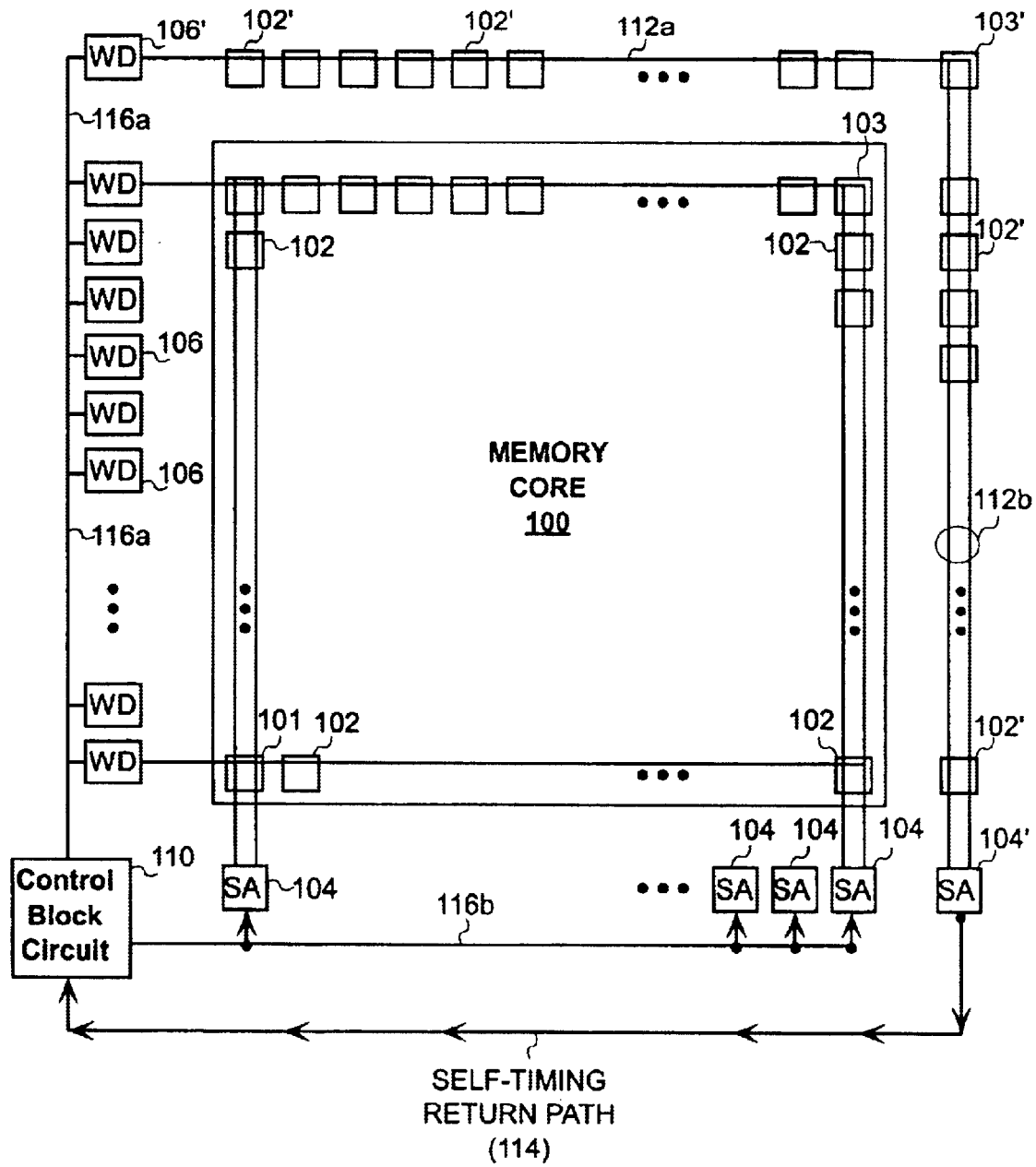
FIG. 1 shows a block diagram of a memory bank having a memory core and associated access circuitry.
Figure 2:
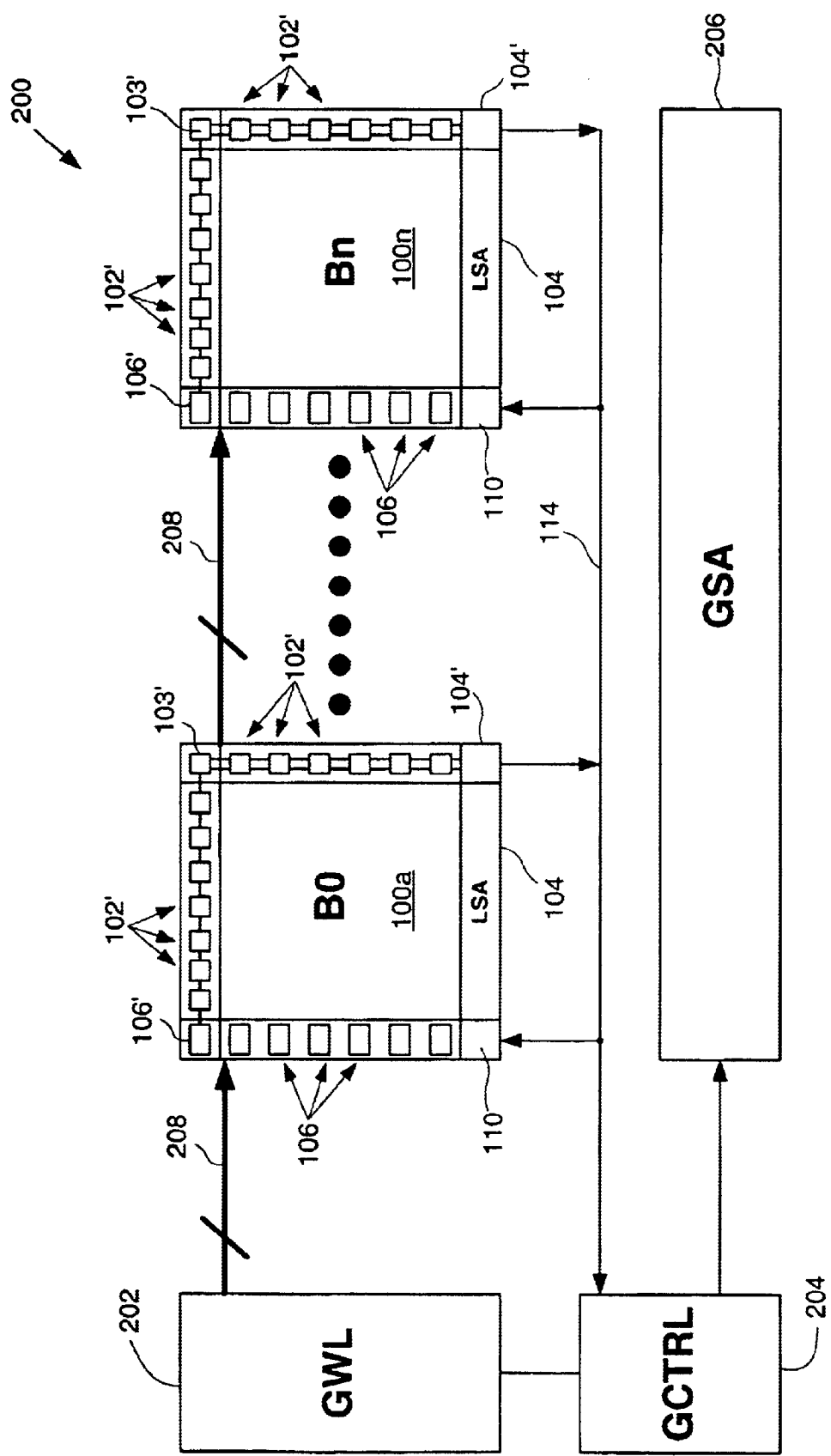
FIG. 2 is a diagram showing a prior art multi-bank memory.
Figure 3:
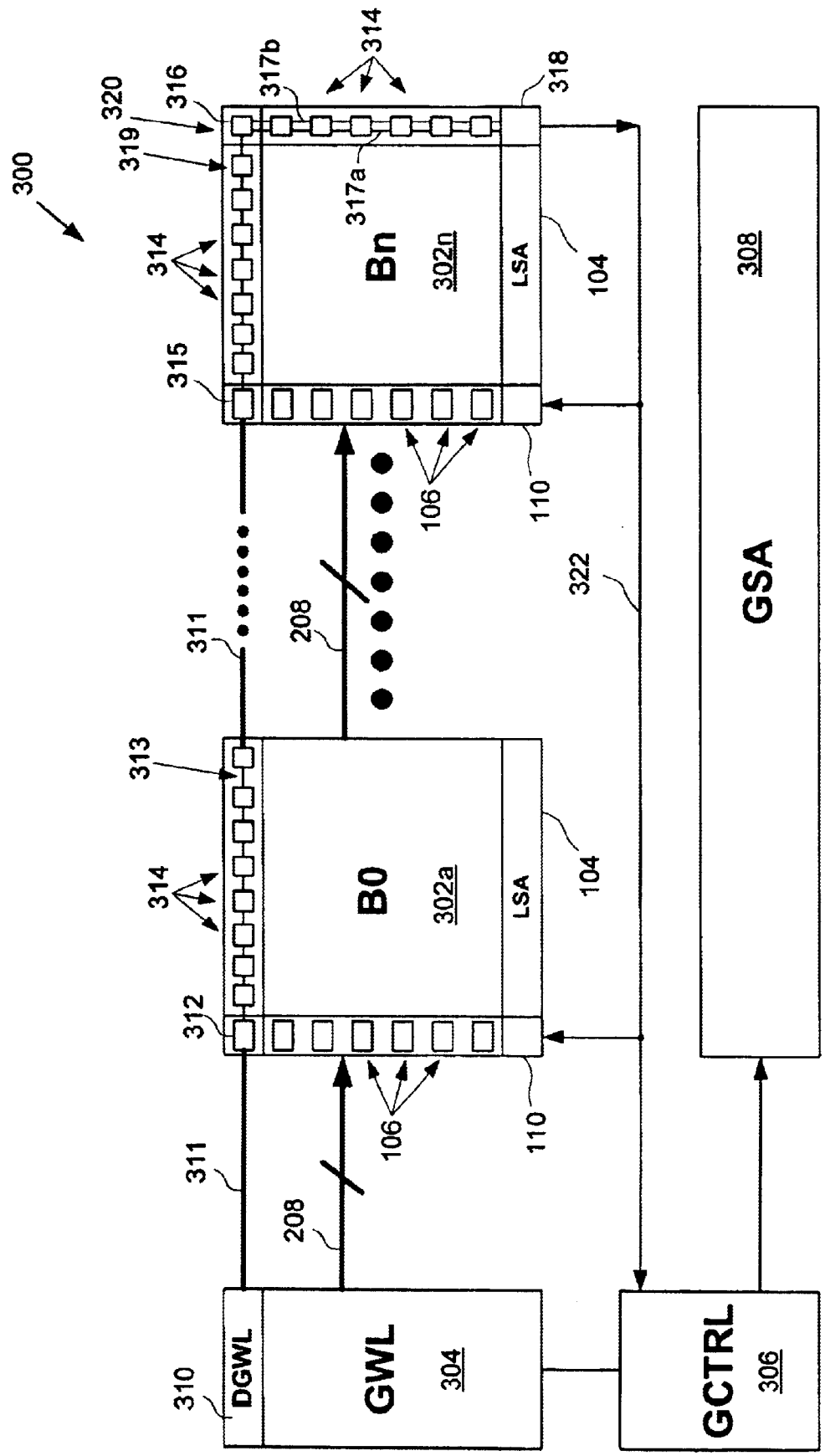
FIG. 3 is a diagram showing a low area multi-bank self-timing system, in accordance with an embodiment of the present invention.

FIGS. 1 and 2 were described in terms of the prior art. FIG. 3 is a diagram showing a low area multi-bank self-timing system 300, in accordance with an embodiment of the present invention. The low area multi-bank self-timing system 300 includes plurality of memory banks B0–Bn, each having a plurality of local wordline drivers 106, local control blocks 110, and local sense amps 104. Global control for the memory banks is provided by a global control block 306, which provides timing for the global wordlines 304, and the global sense amps 308. Although, the low area multi-bank self-timing system 300 of FIG. 3 is shown having global sense amps 308, it should be noted that global sense amps 308 are optional and can be omitted depending on the configuration needed by a particular design.

To provide self-timing, the low area multi-bank self-timing system 300 includes a single global timing column 320 for each row of memory banks B0–Bn. Placement of the global timing column 320 is based on worst case timing. As mentioned previously, the actual delay time of a particular core cell can vary from one core cell to the next, depending on the location of the particular core cell.

Therefore, embodiments of the present invention utilize an RC delay associated with a dummy global wordline 311 that couples a dummy global wordline driver 310 with the global timing column 320. Specifically, the global wordline drivers 304 include a dummy global wordline driver 310 that provides a signal to the dummy global wordline 311 during the rising edge of a global timing pulse (GTP), regardless of which global wordline driver 310 is actually addressed.

The dummy global wordline 311 is provided to a model row of each memory bank B0–Bn in the row of memory banks. Each model row includes a dummy local wordline driver 312, dummy local wordline 313, and a plurality of load cells 314. Generally, the load cells 314 are dummy core cells that mimic a normal core cell load. However, the load cells 314 can be transistors or any other device designed to mimic the load of a normal core cell.

As mentioned above, the global timing column 320 is located on the worst case memory bank. That is, the global timing column 320 generally is located on the memory bank furthest from the global wordline drivers 304. In systems having global wordline drivers 304 located on both sides of the memory banks, the global timing column 320 can be located on a memory bank located between the global wordline drivers 304. In this case, the global wordlines are split, with global wordlines on the left of the memory banks addressing half the memory banks and global wordlines on the right addressing the other half of the memory banks. In this configuration, the global timing column 320 is still located on the memory bank having the worst case timing (i.e., the slowest timing).

In this manner, the RC delay associated with the dummy global wordline 311 that couples a dummy global wordline driver 310 with the global timing column 320 will have a combined RC delay that is larger than any other core cell 102 in the same row of the low area multi-bank self-timing system 300. The global timing column 320 then generates a self-timing reset signal 322 that serves to establish the standard delay time for the entire row of memory banks B0–Bn in the low area multi-bank self-timing system 300.

The self-timing reset signal 322 is provided to the local control block 110 of each memory bank B0–Bn in the row of memory banks B0–Bn. The self-timing reset signal 322 is further provided to the global control block 306 for the row of memory banks B0–Bn. The global control block 306 then uses the self-timing reset signal 322 to provide control to the global wordline drivers 304 and the global sense amps 308. Thus, during operation, the self-timing reset signal 322 resets the active memory bank, or memory banks, and resets the global control block 306, which actives the global sense amps 308.

In operation, a set of addresses selects one or more of the memory banks B0–Bn to be active. That is, the set of addresses enables the local control block 110 of the selected memory banks. A bank select signal coupled to each local control block 110 controls when a local control block 110 should accept the GTP signal, otherwise the local control block 110 ignores the GTP signal. Broadly speaking, each active bank logically ANDs a local clock signal with the selected global wordline 208 to select a row in the memory core. The bitlines are then sensed or used to write to the selected core cells, depending on whether a read or write operation is being performed.

In addition, to provide self-timing, the dummy global wordline driver 310 asserts the dummy global wordline 311 along with the selected global wordline 208. The dummy global wordline 311 then triggers the global timing column 320. In particular, the memory bank Bn having the global liming column 320 includes an active dummy local wordline driver 315, which is always active to drive the load cells of the memory bank Bn. Generally, memory banks other than the memory bank Bn having the global timing column 320 include non-active dummy wordline drivers 312. The active dummy local wordline 319 enables the global timing column 320, which then resets the selected memory banks via the self-timing reset signal 322. As mentioned previously, the self-timing reset signal 322 further is provide to the global control block 306, which resets the GTP signal.

Figure 4:
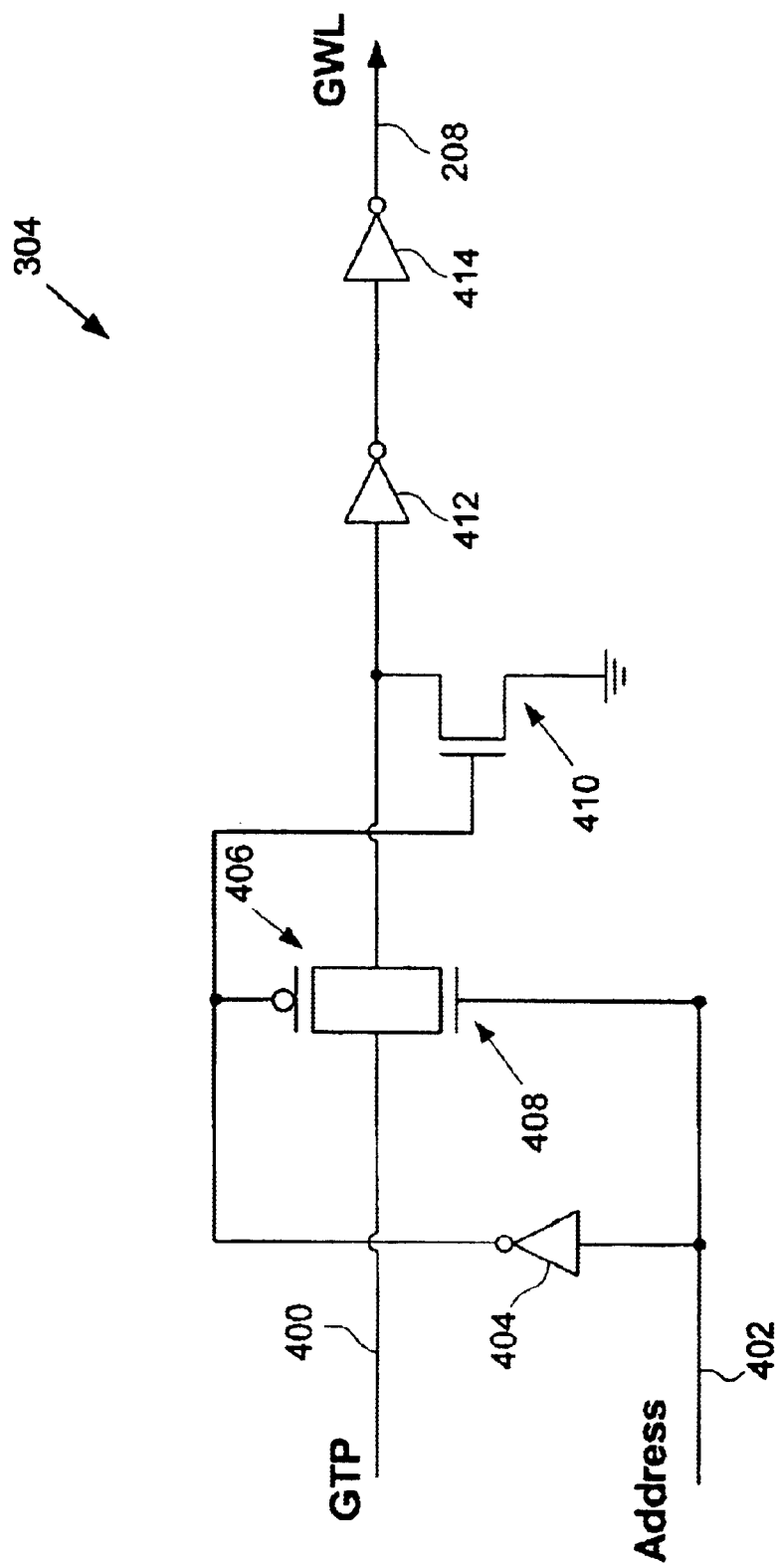
FIG. 4 is a schematic diagram showing a global wordline driver, in accordance with an embodiment of the present invention.

FIG. 4 is a schematic diagram showing a global wordline driver 304, in accordance with an embodiment of the present invention. The global wordline driver 304 includes an inverter 404 that receives an address signal 402, which is used to select the particular global wordline driver 304. In addition, a transmission gate comprising pchannel transistor 406 and n-channel transistor 408 is included. The gate of the p-channel transistor 406 is coupled to the output of inverter 404, and the gate of the n-channel transistor 408 is coupled to the address signal 402. The output of inverter 404 is further coupled to the gate of n-channel transistor 410, which includes a first terminal coupled to the input of inverter 412 and a second terminal coupled to ground. The inverter 412 also receives the output of the transmission gate as an input. The output of the inverter 412 is provided to the input of inverter 414, which provides the global wordline 208 as output.

In operation, the address signal 402 controls the transmission gate, which is comprised of transistors 406 and 408. In particular, when the address signal 402 is high, the gate of transistor 408 is high and the gate of transistor 406 is low via inverter 404. Hence, when the address signal 402 is high, the transmission gate allows the GTP signal to transfer to the input of inverter 412, which transfers a complementary signal to the input of inverter 414. Inverter 414 then inverts the signal again, which transfer the GTP signal to the global wordline 208.

When the address signal 402 is low, the gate of transistor 408 is low and the gate of transistor 406 is high via inverter 404. Thus, both transistors 406 and 408 of the transmission gate turn OFF. As a result, the transmission gate blocks the GTP signal from transferring to the input of inverter 412. Instead, high from inverter 404 is provided to the gate of nchannel transistor 410, grounding the input of inverter 412, which transfers a complementary signal to the input of inverter 414. Inverter 414 then inverts the signal again, which transfer a low to the global wordline 208. In this manner, only selected global wordline drivers will be active and allow the GTP signal to transfer to the associated global wordlines.

Figure 5:
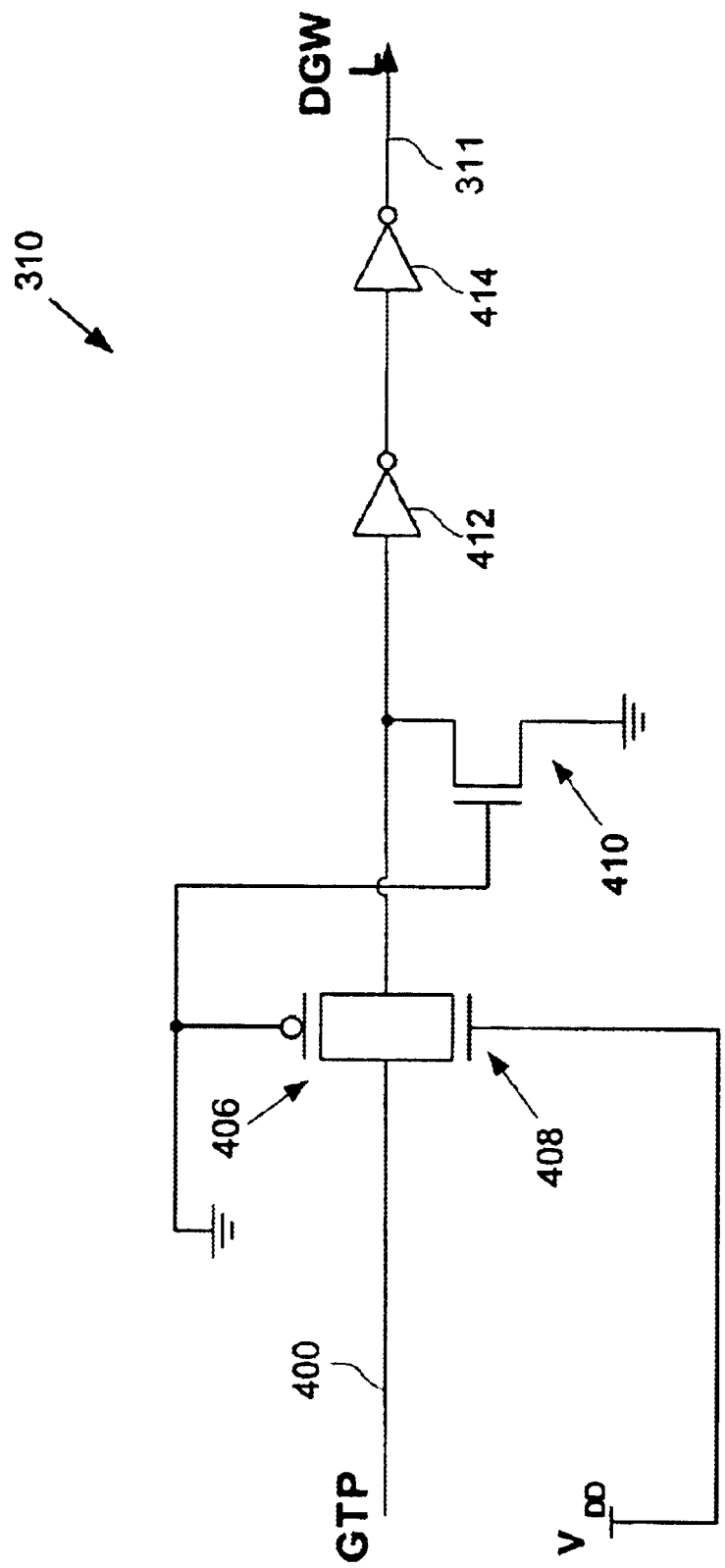
FIG. 5 is a schematic diagram showing a dummy global wordline driver, in accordance with an embodiment of the present invention.

FIG. 5 is a schematic diagram showing a dummy global wordline driver 310, in accordance with an embodiment of the present invention. As mentioned previously, embodiments of the present invention utilize a dummy global wordline driver 310 to provide self-timing for a row of memory banks. As shown in FIG. 5, the dummy global wordline driver 310 follows the GTP signal, regardless of which normal global wordline is selected.

The dummy global wordline driver 310 includes a transmission gate comprising p-channel transistor 406 and n-channel transistor 408. The gate of the p-channel transistor 406 is coupled to ground, while the gate of the n-channel transistor 408 is coupled to VDD. The gate of n-channel transistor 410 is also coupled to ground, and includes a first terminal coupled to the input of inverter 412 and a second terminal coupled to ground. The inverter 412 also receives the output of the transmission gate as an input. The output of the inverter 412 is provided to the input of inverter 414, which provides the dummy global wordline 311 as output.

In operation, the transmission gate, which is comprised of transistors 406 and 408 is configured to allow the GTP signal to transfer to the input of inverter 412 regardless of which normal global wordline is selected. Hence, the transmission gate allows the GTP signal to transfer to the input of inverter 412, which transfers a complementary signal to the input of inverter 414. Inverter 414 then inverts the signal again, which transfers the GTP signal to the dummy global wordline 311. In this manner, the dummy global wordline 311 is activated along with the selected global wordline to provide self-timing for the row of memory banks. In particular, the dummy global wordline 311 is provided to a dummy local wordline driver on each memory bank to simulate a model load on a global wordline.

Figure 6:
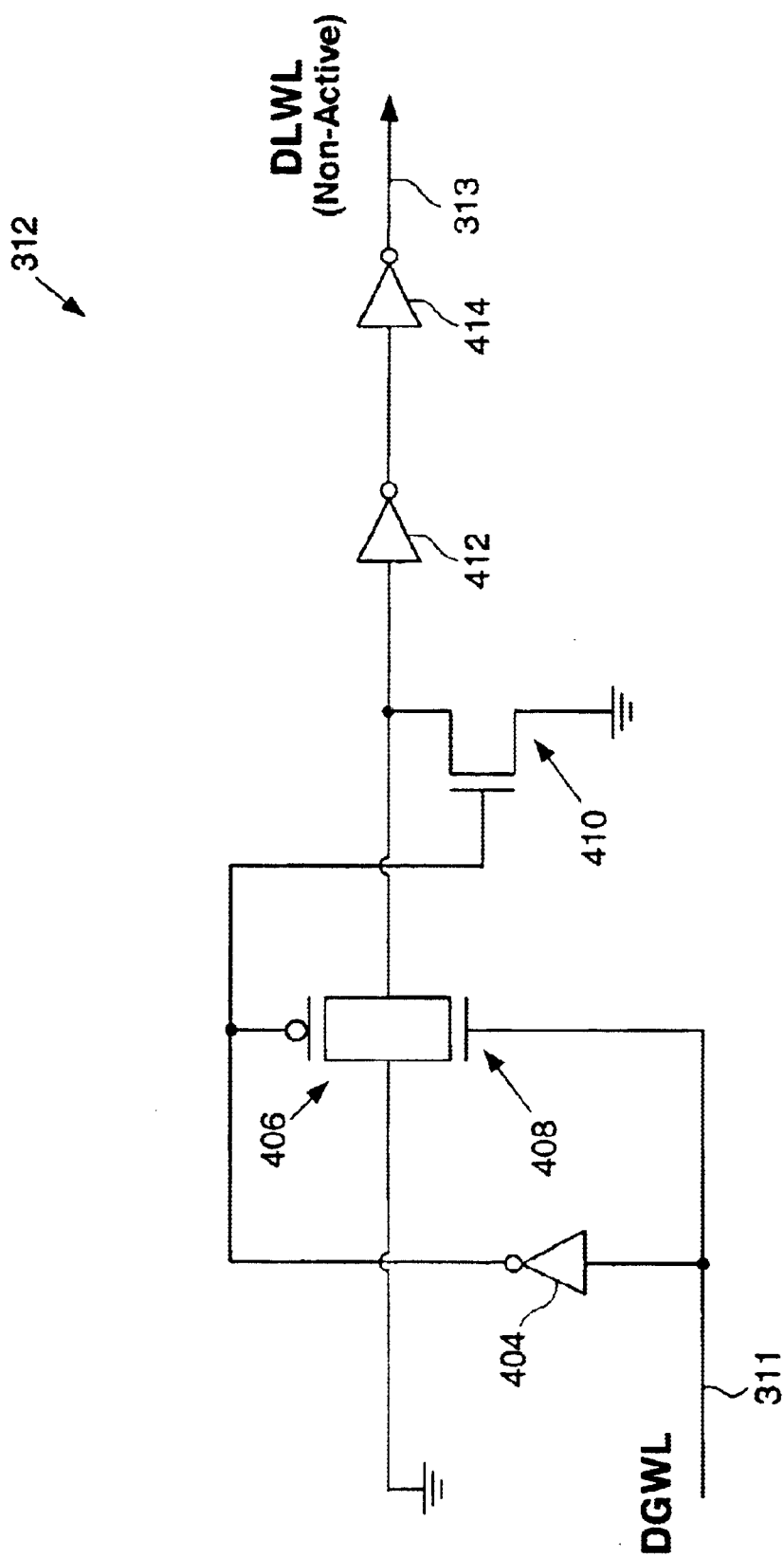
FIG. 6 is a schematic diagram showing a non-active dummy local wordline driver, in accordance with an embodiment of the present invention.

FIG. 6 is a schematic diagram showing a non-active dummy local wordline driver 312, in accordance with an embodiment of the present invention. Each memory bank, except the memory bank having the global timing column, includes a non-active dummy local wordline driver 312 to simulate a normal load on the dummy global wordline 311. Broadly speaking, each non-active dummy local wordline driver 312 transfers a low to the non-active dummy local wordline 313 of the memory bank.

The non-active dummy local wordline driver 312 includes an inverter 404 that receives the dummy global wordline 311 as input. In addition, a transmission gate comprising p-channel transistor 406 and n-channel transistor 408 is included. The gate of the p-channel transistor 406 is coupled to the output of inverter 404, and the gate of the n-channel transistor 408 is coupled to the dummy global wordline 311. The output of inverter 404 is further coupled to the gate of p-channel transistor 410, which includes a first terminal coupled to the input of inverter 412 and a second terminal coupled to ground. The inverter 412 also receives the output of the transmission gate as an input. The output of the inverter 412 is provided to the input of inverter 414, which provides the non-active dummy local wordline 313 as output.

In operation, the dummy global wordline 311 controls the transmission gate, which is comprised of transistors 406 and 408. In particular, when the dummy global wordline 311 is high, the gate of transistor 408 is high and the gate of transistor 406 is low via inverter 404. Hence, when the dummy global wordline 311 is high, the transmission gate allows the low from ground to transfer to the input of inverter 412, which transfers a complementary signal to the input of inverter 414. Inverter 414 then inverts the signal again, which transfer the low to the non-active dummy local wordline wordline 313.

When the dummy global wordline 311 is low, the gate of transistor 408 is low and the gate of transistor 406 is high via inverter 404. Thus, both transistors 406 and 408 of the transmission gate turn OFF. As a result, the transmission gate blocks the low from ground from transferring to the input of inverter 412. Instead, the high at the output of inverter 404 transfers a high to the gate of n-channel transistor 410, which turns ON transistor 410, grounding the input of inverter 412, which transfers a complementary signal to the input of inverter 414. Inverter 414 then inverts the signal again, which transfer a low to the non-active dummy local wordline 313. In this manner, the non-active dummy local wordline 313 is low regardless of the state of the dummy global wordline.

Figure 7:
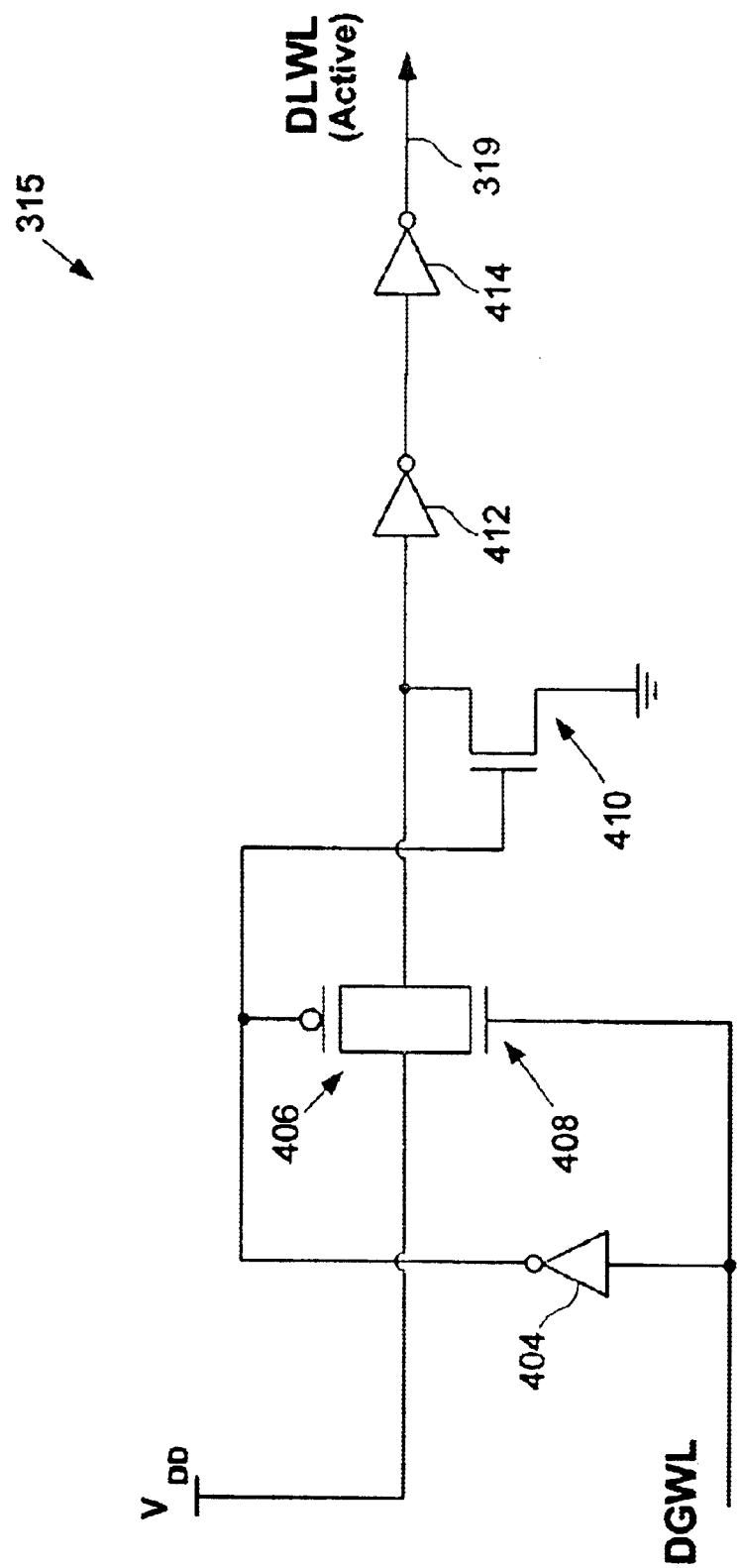
FIG. 7 is a schematic diagram showing an active dummy local wordline driver, in accordance with an embodiment of the present invention.

FIG. 7 is a schematic diagram showing an active dummy local wordline driver 315, in accordance with an embodiment of the present invention. The memory bank having the global timing column includes an active dummy local wordline driver 315, which simulates a normal load on the dummy global wordline 311 and provides a mechanism to trigger the global timing column. Broadly speaking, the active dummy local wordline driver 315 transfers the dummy global wordline signal 311 to the active dummy wordline 319.

Similar to the non-active dummy wordline driver 312 of FIG. 6, the active dummy local wordline driver 315 of FIG. 7 includes an inverter 404 that receives the dummy global wordline 311 as input. In addition, a transmission gate comprising p-channel transistor 406 and n-channel transistor 408 is included. The gate of the p-channel transistor 406 is coupled to the output of inverter 404, and the gate of the n-channel transistor 408 is coupled to the dummy global wordline 311. The output of inverter 404 is further coupled to the gate of n-channel transistor 410, which includes a first terminal coupled to the input of inverter 412 and a second terminal coupled to ground. The inverter 412 also receives the output of the transmission gate as an input. The output of the inverter 412 is provided to the input of inverter 414, which provides the non-active dummy local wordline 313 as output.

In operation, the dummy global wordline 311 controls the transmission gate, which is comprised of transistors 406 and 408. In particular, when the dummy global wordline 311 is high, the gate of transistor 408 is high and the gate of transistor 406 is low via inverter 404. Hence, when the dummy global wordline 311 is high, the transmission gate allows the high from VDD to transfer to the input of inverter 412, which transfers a complementary signal to the input of inverter 414. Inverter 414 then inverts the signal again, which transfer the high from VDD to the active dummy local wordline wordline 319.

When the dummy global wordline 311 is low, the gate of transistor 408 is low and the gate of transistor 406 is high via inverter 404. Thus, both transistors 406 and 408 of the transmission gate turn OFF. As a result, the transmission gate blocks the high from $V_{DD}$ from transferring to the input of inverter 412. Instead, the high from the output of inverter 404 is transferred to the gate of n-channel transistor 410, grounding the input of inverter 412, which transfers a complementary signal to the input of inverter 414. Inverter 414 then inverts the signal again, which transfer a low to the active dummy local wordline 319. As mentioned above, the active dummy local wordline 319 is used to control the global timing column 320, as described next with reference to FIG. 8.

Figure 8:
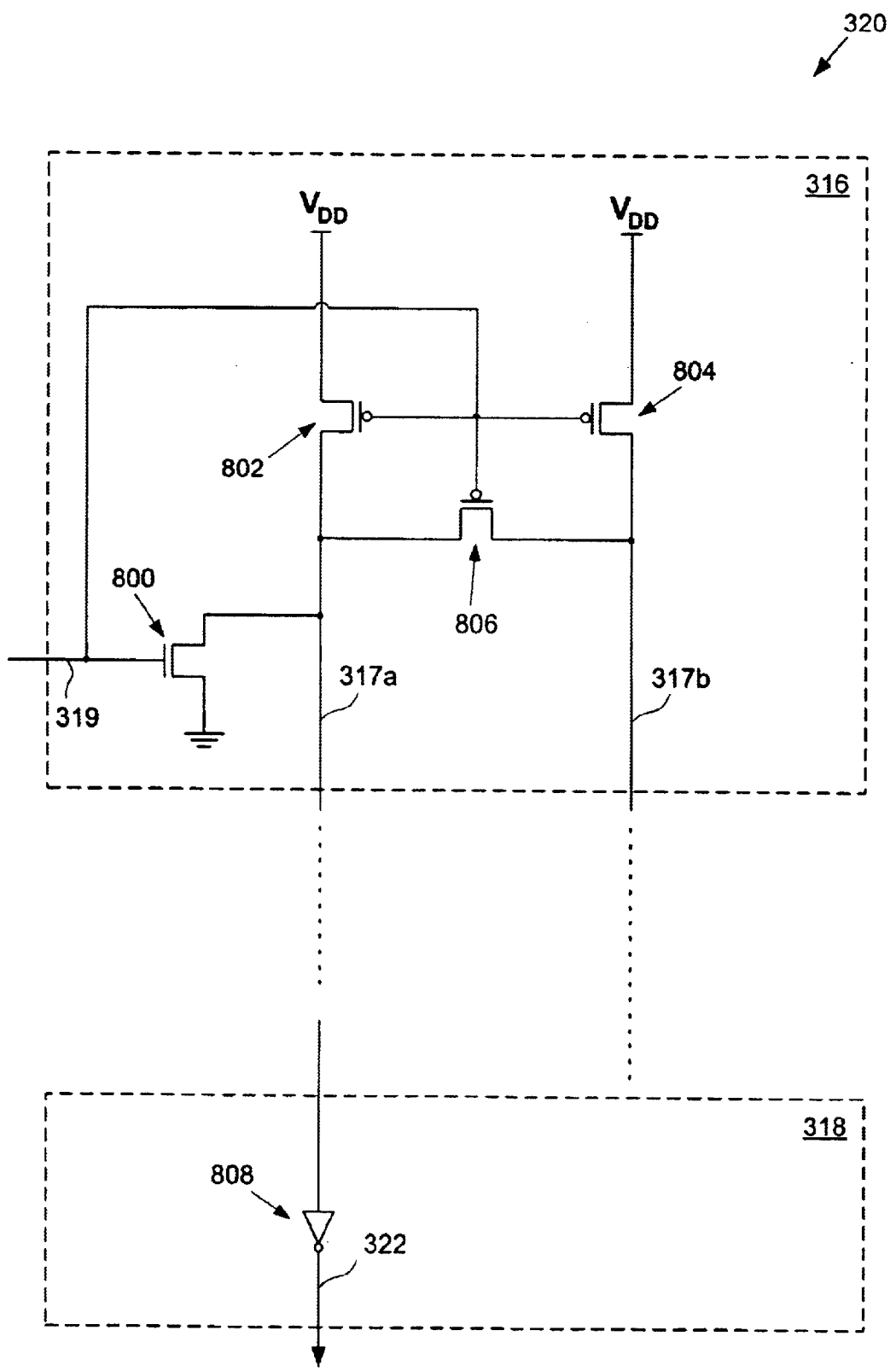
FIG. 8 is a schematic diagram showing an exemplary global timing column, in accordance with an embodiment of the present invention.

FIG. 8 is a schematic diagram showing an exemplary global timing column 320, in accordance with an embodiment of the present invention. As mentioned previously, the global timing column 320 includes a column of core cells coupled together by a pair of bitlines 317a and 317b. In addition, the global timing column includes a precharge cell 316, which includes a precharge circuit and reset transistor 800. The precharge circuit includes p-channel transistors 802, 804, and 806 having co-coupled gates. Transistor 802 includes a first terminal coupled to $V_{DD}$ and a second terminal coupled to bitline 317a. Transistor 804 also includes a first terminal coupled to $V_{DD}$ and a second terminal coupled to bitline 317b. Transistor 806 has a first terminal coupled to bitline 317a and a second terminal coupled to bitline 317b, and is used to equalize the bitlines 317a and 317b during precharge. The reset n-channel transistor 800 includes a first terminal coupled to bitline 317a and a second terminal coupled to ground. In addition, transistor 800 has a gate coupled to the active dummy local wordline 319. Although, FIGS. 3 and 8 are described in terms of differential bitline pairs, it should be noted that embodiments of the present invention can be utilized in memories having single bitlines, as will be apparent to those skilled in the art after a careful reading of the present disclosure.

In operation, the active dummy local wordline 319 provides control to the precharge cell 316. Specifically, when the active dummy local wordline 319 is low, the gate of reset transistor 800 is low, and as a result, reset transistor 800 turns OFF. In addition, the low on the active dummy local wordline 319 is transferred to the gates of the precharge transistors 802, 804, and 806. Hence, transistors 802, 804, and 806 turn ON, allowing the bitlines 317a and 317b to go high.

When the active dummy local wordline 319 is high, the precharge transistors 802, 804, and 806 turn OFF. In addition, the high on the active dummy local wordline 319 transfers to the gate of the reset transistor 800, which turns ON and pulls the bitline 317a low. The low on the bitline 317a transfers to the input of inverter 808 in the sense amplifier 318. As a result, inverter 808 transfers a high to the self-timing reset signal 322, which then is provided to the active memory banks and the global control block.

Although embodiments of the present invention have been described in terms of differential bitlines, it should be noted that embodiments of the present invention can be utilized with a single bitline memory array. That is, in a memory array where a single bitline is used for a particular column (i.e., as opposed to a differential bitline pair per column.)

In one embodiment, optimum placement and utilization of the techniques of the present invention is implemented utilizing a generator. The generator should he generally understood to include one or more generators, each generator can be specifically optimized for a particular task. Such tasks or sub-tasks, for example, can include generating a memory bank row having a single global timing column (e.g., as shown in FIG. 3) to be used with a memory device.

Figure 9A:
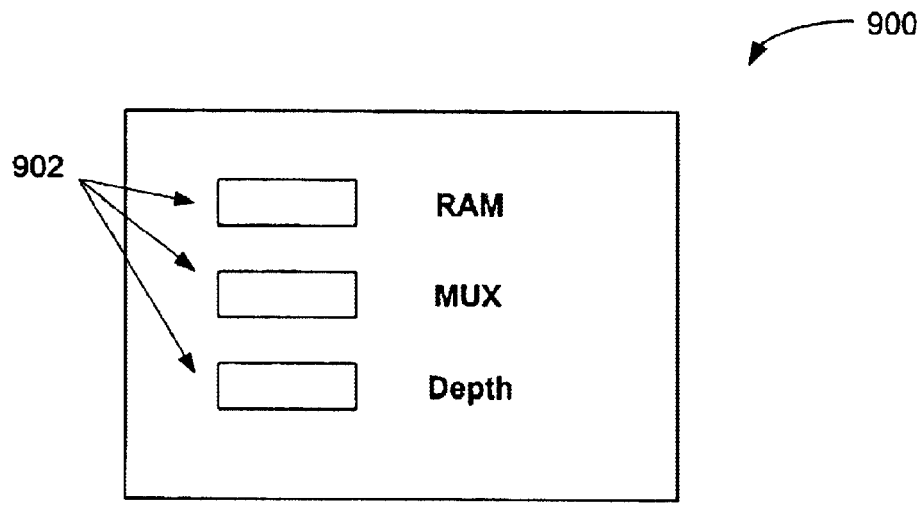
FIG. 9A is a block diagram showing an exemplary simplified memory generator graphical user interface (GUI) front end, in accordance with an embodiment of the present invention.

FIG. 9A is a block diagram showing an exemplary simplified memory generator graphical user interface (GUI) front end 900, in accordance with an embodiment of the present invention. The exemplary memory generator GUI 900 illustrates one view utilized for entering parameters into fields 902 to define a particular memory application. Broadly speaking, the memory generator checks the validity of the entered data and executes appropriate generators to define the memory application. After receiving data utilizing the GUI front end view 900, a memory generator of the embodiments of the present invention processes the data utilizing a memory generator backend, as described next with reference to FIG. 9B.

Figure 9B:
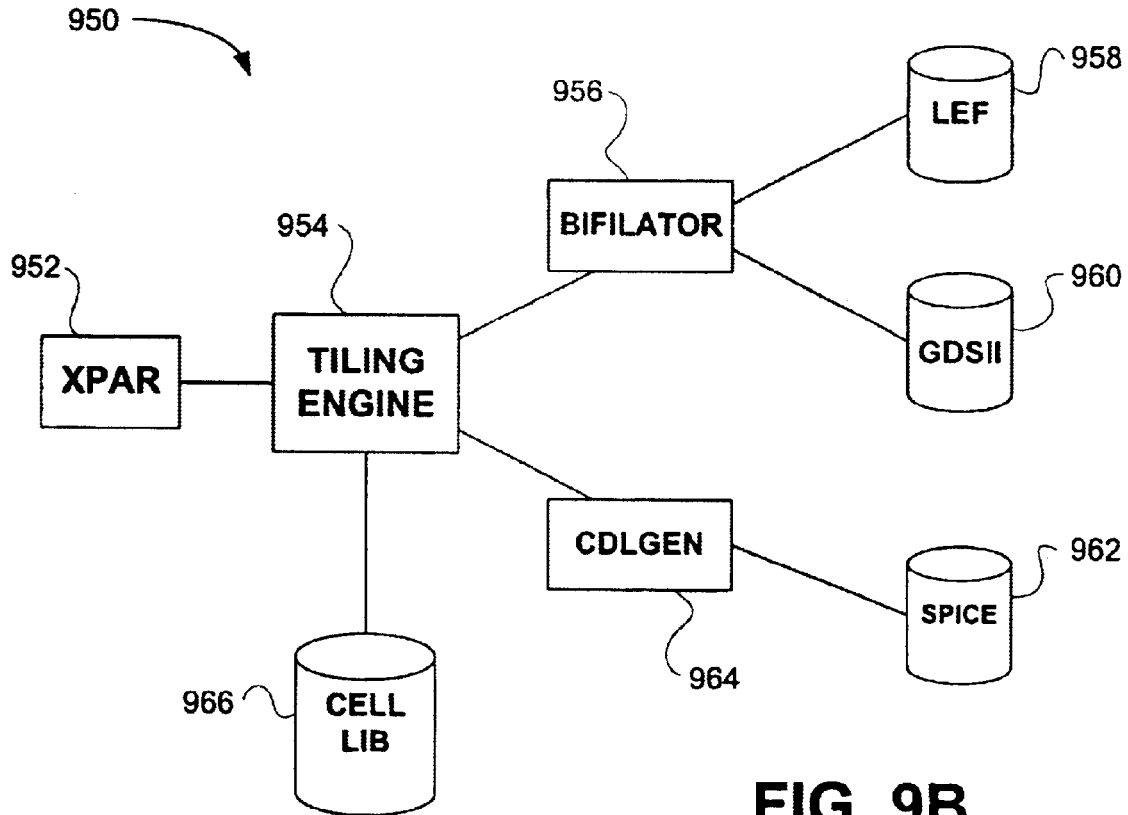
FIG. 9B is a block diagram showing an exemplary memory generator backend, in accordance with an embodiment of the present invention.

FIG. 9B is a block diagram showing an exemplary memory generator backend 950, in accordance with an embodiment of the present invention. The memory generator backend 950 comprises an XPAR process 952, a tiling engine 954, a Bifilator process 956, a CDLGEN process 964, and a cell library 966. Generally speaking, these processes function together to generate a LEF model 958, a GDSII model 960, and a SPICE model 962 for the particular memory application. The LEF model 958 comprises place and route information, which is utilized by routers to manufacture integrated circuits. The GDSII model 960 comprises mask layouts and is utilized by semiconductor foundries. The SPICE model 962 includes circuit interconnection definitions, operational properties, and schematic diagrams of the memory application. Thus, the designer can use the SPICE model of the application for cross verification.

As mentioned above, the exemplary memory generator backend 950 processes the data received via the GUI front end 900. More specifically, the XPAR process 952 encapsulates the rules needed to utilize particular cell layouts stored in the cell library. These rules, along with the parameter data for the memory application are then provided to the tiling engine 954 for optimization and cell placement. By separating the functions of the XPAR process 952 from those of the tiling engine 954, individual rules can be altered for specific applications without altering the functions and placement algorithms utilized in the timing engine 954.

The Bifilator process 956 generates an interface around a particular device or memory array. Generally, on a RAM there may exist over one thousand routing points for interfacing with the RAM. As a result, the entire routing configuration may change when a user changes the placement of the RAM, requiring intense reconfiguration. To address this issue, the Bifilator process 956 builds an interface around the RAM, which the user can use to interface with the RAM without configuring each routing point.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A self-timing system for a memory device, comprising:
   a dummy global wordline signal configured to follow a global timing pulse for a memory device;
   a row of at least one non-timing memory banks, each non-timing memory bank including a model row in electrical communication with the dummy global wordline signal, each model row comprising a plurality of load cells; and a timing memory bank having a global timing column comprising a plurality of load cells coupled via at least one bit line, the global timing column responding to the dummy global wordline signal to provide a self-timing reset signal for the memory device, wherein the self-timing reset signal is provided to each active memory bank in the row of memory banks.

2. A self-timing system as recited in claim 1, wherein the timing memory bank having the global timing column is located such that the global timing column responds slower to global wordlines than all other core cells in the row of memory banks.

3. A self-timing system as recited in claim 2, wherein the load cells are core cells.

4. A self-timing system as recited in claim 2, wherein the load cells are transistors configured to mimic a load of a core cell.

5. A self-timing system as recited in claim 2, wherein the timing memory bank includes a model row of load cells in communication with an active dummy local wordline signal, the active dummy local wordline signal configured to follow the dummy global wordline signal.

6. A self-timing system as recited in claim 5, wherein the model row in each non-timing memory bank is in communication with a non-active dummy local wordline signal, the non-active dummy local wordline signal configured to have a low value.

7. A self-timing system as recited in claim 1, wherein the self-timing system is designed using a generator.

8. A method for self-timing synchronization for a row of memory banks in a memory device, comprising the operations of:
   providing a dummy global wordline signal to at least two memory banks, each memory bank including a model row in electrical communication with the dummy global wordline signal, each model row comprising a plurality of load cells;
   providing a self-timing reset signal for the memory device using a single global timing column in electrical communication with the dummy global wordline signal, wherein the global timing column comprising a plurality of load cells; and
   resetting each active memory bank in the row of memory banks using the self-timing reset signal.

9. A method as recited in claim 8, wherein a memory bank having the global timing column is located such that the global timing column responds slower to global wordlines than all other core cells in the row of memory banks.

10. A method as recited in claim 9, wherein the load cells are core cells.

11. A method as recited in claim 9, wherein the load cells are transistors configured to mimic a load of a core cell.

12. A method as recited in claim 9, wherein the memory bank having the global timing column includes a model row of load cells in communication with an active dummy local wordline signal, the active dummy local wordline signal configured to follow the dummy global wordline signal.

13. A method as recited in claim 8, further comprising the operation of designing the memory device using a generator.

14. A memory device having a self-timing system for each row of memory banks, comprising:
   a plurality of global wordlines drivers providing a plurality of global wordline signals to a row of memory banks, each global wordline signal configured to follow a global timing signal when the particular global wordline is selected; and
   a dummy global wordline signal configured to follow a global timing pulse,
   wherein the row of memory banks includes at least two non-timing memory banks, each non-timing memory bank including a model row in electrical communication with the dummy global wordline signal, each model row comprising a plurality of load cells, and wherein the row of memory banks further includes a timing memory bank having a global timing column comprising a plurality of load cells coupled via at least one bit line, the global timing column responding to the dummy global wordline signal to provide a self-timing reset signal for the memory device, wherein the self-timing reset signal is provided to each active memory bank in the row of memory banks.

15. A memory device as recited in claim 14, wherein the timing memory bank is located such that the global timing column responds slower to global wordlines than all other core cells in the row of memory banks.

16. A memory device as recited in claim 15, wherein the timing memory bank is located further from the global wordline drivers than each non-timing memory bank.

17. A memory device as recited in claim 15, wherein the load cells are core cells.

18. A memory device as recited in claim 15, wherein the load cells are transistors configured to mimic a load of a core cell.

19. A memory device as recited in claim 15, wherein the timing memory bank includes a model row of load cells in communication with an active dummy local wordline signal, the active dummy local wordline signal configured to follow the dummy global wordline signal.

20. A memory device as recited in claim 14, wherein the memory device is designed using a generator.

* * * * *